United States Patent
Itoh

(10) Patent No.: US 8,766,420 B2
(45) Date of Patent: Jul. 1, 2014

(54) SEMICONDUCTOR DEVICE

(75) Inventor: Shingo Itoh, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 203 days.

(21) Appl. No.: 13/394,642

(22) PCT Filed: Aug. 27, 2010

(86) PCT No.: PCT/JP2010/005298
§ 371 (c)(1),
(2), (4) Date: Mar. 7, 2012

(87) PCT Pub. No.: WO2011/030516
PCT Pub. Date: Mar. 17, 2011

(65) Prior Publication Data
US 2012/0168927 A1    Jul. 5, 2012

(30) Foreign Application Priority Data
Sep. 8, 2009   (JP) .................................. 2009-206535

(51) Int. Cl.
*H01L 23/495*   (2006.01)
(52) U.S. Cl.
USPC ........... 257/676; 257/687; 257/787; 257/788; 257/789; 257/E23.052; 257/E23.121
(58) Field of Classification Search
USPC .......... 257/676, 687, 787, 788, 789, E23.052, 257/E23.121
See application file for complete search history.

(56) References Cited

U.S. PATENT DOCUMENTS

| | | | |
|---|---|---|---|
| 6,323,263 B1 * | 11/2001 | Kuwabawa et al. | 523/443 |
| 7,755,175 B2 | 7/2010 | Ishida et al. | |
| 2005/0236698 A1 | 10/2005 | Ozawa et al. | |
| 2011/0171777 A1 * | 7/2011 | Muto | 438/107 |

FOREIGN PATENT DOCUMENTS

| | | |
|---|---|---|
| JP | 3-201468 A | 9/1991 |
| JP | 2001-151866 A | 6/2001 |
| JP | 2001-332684 A | 11/2001 |
| JP | 2005-340766 A | 12/2005 |
| JP | 2006-19531 A | 1/2006 |
| JP | 2006-100777 A | 4/2006 |
| JP | 2006-278401 A | 10/2006 |
| JP | 2007-134486 A | 5/2007 |

OTHER PUBLICATIONS

PCT/ISA/210—International Search Report dated Oct. 5, 2010, issued in PCT/JP2010/005298.

* cited by examiner

*Primary Examiner* — Peniel M Gumedzoe
(74) *Attorney, Agent, or Firm* — Birch, Stewart, Kolasch & Birch, LLP

(57) ABSTRACT

A semiconductor device is configured that two or more semiconductor elements are stacked and mount on a lead frame, the aforementioned lead frame is electrically joined to the semiconductor element with a wire, and the semiconductor element, the wire and an electric junction are encapsulated with a cured product of an epoxy resin composition for encapsulating semiconductor device, and that the epoxy resin composition for encapsulating semiconductor device contains (A) an epoxy resin; (B) a curing agent; and (C) an inorganic filler, and that the (C) inorganic filler contains particles having particle diameter of equal to or smaller than two-thirds of a thinnest filled thickness at a rate of equal to or higher than 99.9% by mass.

13 Claims, 1 Drawing Sheet

SEMICONDUCTOR DEVICE

TECHNICAL FIELD

The present invention relates to a semiconductor device.

BACKGROUND ART

Multiple-chip technology is developed under the requirements of downsizing, weight-reduction, and performance-enhancement for electronic equipments. Enhancements of performances are achieved by organizing a plurality of semiconductor elements into a semiconductor device of a single package conformation, and/or by reducing area for installing the elements on an electronic equipment, and/or by utilizing shorter interconnect distances between respective semiconductor elements (see, for example, Patent Documents 1, 2 and 3).

Conventionally, a junction between a semiconductor element and a lead terminal of a lead frame is generally formed of a gold wire (see, for example, paragraph 0015 of Patent Document 3).

In addition, conventionally, encapsulations for semiconductor devices such as integrated circuits, diodes, transistors and the like are formed mainly with cured products of epoxy resin compositions for encapsulating semiconductor devices. In particular, an epoxy resin composition for encapsulating semiconductor device, which contain an epoxy resin, a phenolic resin-based curing agent, and an inorganic filler, and exhibits better thermal resistance and humidity resistance, is employed for integrated circuits. In recent years, requirements for epoxy resin compositions for encapsulating semiconductor chips, which are employed for encapsulating semiconductor elements, growingly become more severe, under a situation where the level of the integration of the semiconductor elements are increased year by year and the surface mountability of semiconductor devices is increased.

An application to the semiconductor device employing multiple-chip technology is one of the solutions for such severe requirements. Devices of the multiple-chip type, which particularly includes stacked layers of semiconductor elements, has a current path that is narrowly complicated, and therefore fluidization of the epoxy resin composition for encapsulating semiconductor chips in the molding process are considerably limited. Thus, a problem of poor filling of the epoxy resin composition for encapsulating semiconductor chips is generated.

RELATED DOCUMENTS

Patent Documents

PATENT DOCUMENT 1: Japanese Patent Laid-Open No. 2005-340,766
PATENT DOCUMENT 2: Japanese Patent Laid-Open No. 2006-019,531
PATENT DOCUMENT 3: Japanese Patent Laid-Open No. 2007-134,486
PATENT DOCUMENT 4: Japanese Patent Laid-Open No. 2001-151,866

DISCLOSURE OF INVENTION

Summary of the Invention

Problems to be Solved by the Invention

The present invention is to provide a semiconductor device with improved reliability, which exhibits reduced generation of poor filling of an epoxy resin composition for encapsulating a semiconductor chip.

BRIEF SUMMARY OF THE INVENTION

The present inventions are as follows.

[1]
A semiconductor device, wherein two or more semiconductor elements are stacked and mount on a lead frame, the lead frame is electrically joined to the semiconductor element with a wire, and the semiconductor element, the wire and an electric junction are encapsulated with a cured product of an epoxy resin composition for encapsulating semiconductor device, wherein the epoxy resin composition for encapsulating semiconductor device contains (A) an epoxy resin; (B) a curing agent; and (C) an inorganic filler, and wherein the (C) inorganic filler contains particles having particle diameter of equal to or smaller than two-thirds of a thinnest filled thickness at a rate of equal to or higher than 99.9% by mass.

[2]
The semiconductor device according to [1], wherein the semiconductor elements are stacked to provide an air gap, and the air gap is filled with the cured product of the epoxy resin composition for encapsulating semiconductor device to constitute a filled section having the thinnest filled thickness.

[3]
The semiconductor device according to [2], wherein the thinnest thickness of the air gap between the semiconductor element and the semiconductor element or the air gap between the semiconductor element and the lead frame along the stack direction is equivalent to the thinnest filled thickness.

[4]
The semiconductor device according to any one of [1] to [3], wherein the wire is a copper wire.

[5]
The semiconductor device according to any one of [1] to [4], wherein the semiconductor elements are stacked to be mount on the lead frame through a spacer, and wherein the (C) inorganic filler contains particles having particle diameter of equal to or smaller than two-thirds of the thickness of the spacer at a rate of equal to or higher than 99.9% by mass.

[6]
The semiconductor device according to any one of [1] to [5], wherein the (C) inorganic filler contains silica.

[7]
The semiconductor device according to any one of [1] to [6], wherein the lead frame is electrically joined to the semiconductor element by a reverse bonding of the wire.

[8]
The semiconductor device according to [4], wherein purity of copper in the copper wire is equal to or higher than 99.99% by mass.

[9]
The semiconductor device according to [4] or [8], wherein the copper wire includes a coating layer on the surface, the coating layer being composed of a metallic material containing palladium.

[10]

The semiconductor device according to [9], wherein the thickness of the coating layer is equal to or larger than 0.001 µm and equal to or smaller than 0.02 µm.

[11]

The semiconductor device according to [5], wherein the thickness of the spacer is equal to or larger than 0.01 mm and equal to or smaller than 0.2 mm.

Advantageous Effect of the Invention

According to the present invention, a semiconductor device with improved reliability, which exhibits reduced generation of poor filling of an epoxy resin composition for encapsulating a semiconductor chip, can be obtained.

BRIEF DESCRIPTION OF THE DRAWINGS

The above and other objects, advantages and features of the present invention will be more apparent from the following description of certain preferred embodiments taken in conjunction with the accompanying drawings.

Figure 1:
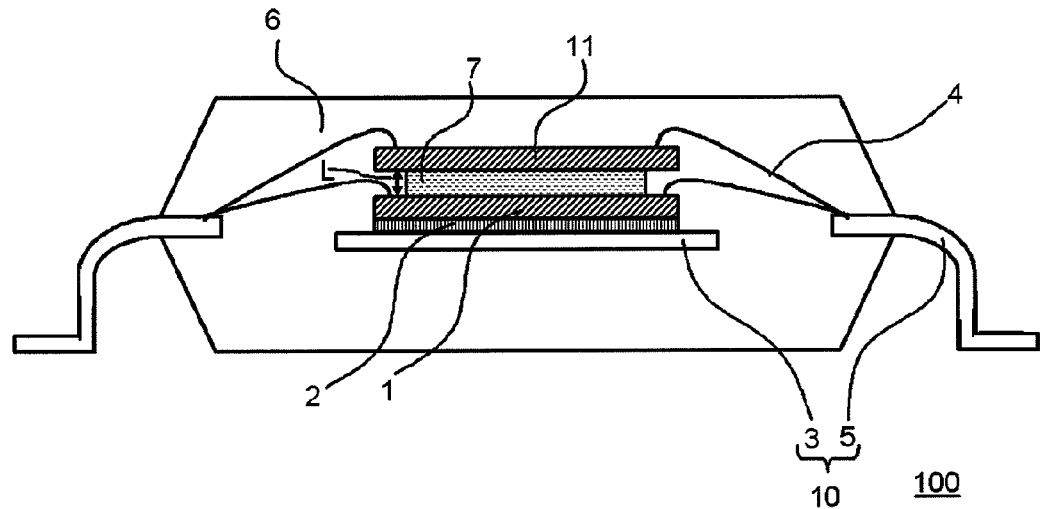
[FIG. 1]

It is a diagram, illustrating a cross-sectional structure of an example of a semiconductor device according to the present invention.

[FIG. 2]

It is a diagram, illustrating a cross-sectional structure of an example of a semiconductor device according to the present invention.

DESCRIPTION OF EMBODIMENTS

Semiconductor devices of the present invention will be described in detail below. A semiconductor device of the present invention is a semiconductor device, in which two or more semiconductor elements are stacked and installed to a lead frame, the lead frame is electrically joined to the semiconductor element with a wire, and the semiconductor element, the wire and an electric junction are encapsulated with a cured product of an epoxy resin composition for encapsulating semiconductor device according to the present invention, in which the epoxy resin composition for encapsulating semiconductor device contains (A) an epoxy resin; (B) a curing agent; and (C) an inorganic filler, and in which (C) the inorganic filler contains particles having particle diameter of equal to or smaller than two-thirds of the thinnest filled thickness at a rate of equal to or higher than 99.9% by mass, and which exhibits an improved reliability, which allows reduced generation of poor filling of an epoxy resin composition for encapsulating a semiconductor chip.

Respective features will be described in detail below.

First of all, descriptions on wires employed for the semiconductor device of the present invention will be made. A wire is employed for electrically coupling a lead frame with a semiconductor element installed on the lead frame. In the field of semiconductor elements, fine pitch of pads and reduced wire diameter are required in order to provide improved density of elements, and more specifically, a wire diameter of equal to or smaller than 30 µm, and more preferably of equal to or smaller than 25 µm is required. The wire is not particularly limited to any specific wire, and for example, it is preferable to contain gold, aluminum, copper, copper alloy and the like. In addition, the wire preferably contains copper as a major constituent, in view of providing better electric characteristics and reduced costs.

The copper wire, which can be employed for the semiconductor device of the present invention, preferably has a wire diameter of equal to or smaller than 30 µm and more preferably of equal to or smaller than 25 µm, and also has a wire diameter of equal to or larger than 15 µm. Such range allows providing stable shape of the ball at the tip of the copper wire to provide improved coupling reliability of the junction. In addition, the use of the copper wire as the wire allows achieving reduced wire sweep due to the rigidity of the copper wire itself.

While the copper wire according to the present invention is not particularly limited, it is preferable to contain copper at a rate of equal to or higher than copper purity of 99.99% by mass, and more preferably equal to or higher than 99.999% by mass. While an addition of various types of chemical elements (dopant) to copper generally allows attempted stabilization of the shape in the side of the ball at the tip of the copper wire in the joining process, an addition of a large quantity of a dopant at a rate of larger than 0.01% by mass produces increased hardness of the ball section in the creation of the wire junction to create a damage to the side of the electrode pad in the semiconductor chip to cause defects such as deterioration of reliability in the moisture resistance due to the insufficient juncture, deterioration of storage characteristic at high temperature, increased electrical resistivity and the like. On the contrary, a use of a copper wire of copper purity of equal to or higher than 99.99% by mass provides sufficiently flexible ball section, and therefore there is no threat to cause damage to the side of the pad in the creation of the junction. In addition to above, a dopant such as Ba, Ca, Sr, Be, Al or rare earth metals and the like may be doped to copper which composes a core line at a concentration of, for example, 0.001 to 0.003% by mass in the copper wire applicable for the semiconductor device of the present invention to provide improved shape of the ball and improved strength in the junction.

While the copper wire according to the present invention is not limited to any particular configuration, it may preferably include a cover layer composed of a metallic material containing palladium on the surface. Such cover layer preferably cover at least the entire surface of the tip of the copper wire in the junction, and more preferably covers the entire surface of the whole copper wire. This allows providing stable shape of the ball at the tip of the copper wire, so that improved coupling reliability of the junction is achieved. Further, this provides an advantageous effect for preventing deterioration by the oxidization of the copper composing the core line to provide improved high temperature storage characteristic of the junction.

The thickness of the cover layer composed of the metallic material containing palladium in the copper wire according to the present invention is preferably 0.001 to 0.02 µm, and more preferably 0.005 to 0.015 µm (hereinafter, the numeral range "a to b" represents that upper limit b and lower limit a are included.). When the thickness is larger than the above-described upper limit, copper composing the core line and the metallic material serving as a coating material containing palladium are not sufficiently melted in the wire bonding process, which leads to unstable shape of the ball, such that there is a threat for deteriorated moisture resistance of the junction and deteriorated high temperature storage characteristics. On the other hand, when the thickness is smaller than the above-described lower limit, deterioration by the oxidization of copper in the core line cannot be sufficiently prevented, such that there is similarly a threat for deteriorated moisture resistance of the junction and deteriorated high temperature storage characteristics.

The copper wire according to the present invention is obtained by a process, in which copper alloy is cast in a smelting furnace, the ingot thereof is rolled with a roller, and further, a drawing process is conducted by using a die, and the wire is heated while being continually swept, and thereafter, a thermal processing is conducted to obtain the copper wire. Further, the cover layer according to the present invention can be formed by a process, in which a wire having a targeted diameter is prepared in advance, and the wire is immersed in an electrolytic solution containing palladium or a non-electrolytic solution and continually swept to be plated. In such case, the thickness of the cover layer according to the present invention can be adjusted by the sweep rate. Meanwhile, another process can be employed, in which a wire having thicker than the target is prepared, and the wire is immersed in an electrolytic solution or a non-electrolytic solution and continually swept to form a cover layer, and further, the wire is drawn until a predetermined diameter is obtained.

Next, epoxy resin compositions for encapsulating semiconductor devices employed for semiconductor devices of the present invention will be described. The epoxy resin composition for encapsulating semiconductor device according to the present invention contains (A) an epoxy resin, (B) a curing agent, and (C) an inorganic filler, in which (C) inorganic filler contains particles having particle diameter of equal to or smaller than two-thirds of the thinnest filled thickness at a rate of equal to or higher than 99.9% by mass. Respective constituents of the epoxy resin composition for encapsulating semiconductor device according to the present invention will be described below.

In the epoxy resin composition for encapsulating semiconductor device according to the present invention, (A) epoxy resin can be employed. (A) the epoxy resin generally includes all of monomer, oligomer and polymer having two or more epoxy group in a single molecular, and while the molecular weight and the molecular structure are not particularly limited, such epoxy resin includes, for example: crystalline epoxy resins such as biphenyl epoxy resins, bisphenol epoxy resins, stilbene epoxy resins and the like; novolac epoxy resins such as phenol novolac epoxy resins, creosol novolac epoxy resins and the like; polyfunctional epoxy resins such as triphenol methane epoxy resins, alkyl-modified triphenol methane epoxy resins and the like; aralkyl epoxy resins such as phenol aralkyl epoxy resins having phenylene backbone, phenol aralkyl epoxy resins having biphenylene backbone and the like; naphthol epoxy resin such as dihydroxynaphthalene epoxy resins, epoxy resins obtained by etherifying dimers of dihydroxynaphthalene with glycidyl ether, and the like; triazine nucleus-containing epoxy resins such as triglycidyl isocyanurate, monoallyl diglycidylisocyanurate and the like; and bridged cyclic hydrocarbon-modified phenol epoxy resins such as dicyclopentadiene-modified phenol epoxy resins and the like, and these may be employed alone or in a form of a combination of two or more thereof.

While the lower limit of the formulation rate of (A) the whole epoxy resin is not particularly limited, it is preferable to be equal to or higher than 3% by mass over the whole epoxy resin composition for encapsulating semiconductor device according to the present invention, and it is more preferable to be equal to or higher than 5% by mass. The formulation rate of (A) the whole epoxy resin within the above-described range provides reduced threats for causing a wire break due to an increased viscosity. In addition, while the upper limit of the formulation rate of (A) the whole epoxy resin is not particularly limited, it is preferable to be equal to or lower than 20% by mass over the whole epoxy resin composition for encapsulating semiconductor device according to the present invention, and it is more preferable to be equal to or lower than 18% by mass. The upper limit of the formulation rate of (A) the whole epoxy resin within the above-described range provides reduced threats for causing deterioration of reliability in the moisture resistance due to increased water absorption and the like.

In the epoxy resin composition for encapsulating semiconductor device according to the present invention, (B) curing agent can be employed. (B) the curing agents can be classified into three types including, for example, curing agents of polyaddition type, curing agents of catalyst type, and curing agents of condensation type.

(B) the curing agent of polyaddition type typically includes, for example: aliphatic polyamines such as diethylene triamine (DETA), triethylene tetramine (TETA), meta-xylylene diamine (MXDA) and the like; polyamine compounds such as aromatic polyamines including diaminodiphenyl methane (DDM), m-phenylenediamine (MPDA), diaminodiphenylsulphone (DDS) and the like, and in addition dicyandiamide (DICY), organic acid dihydrazides and the like; acid anhydrides such as alicyclic acid anhydrides including hexahydro phthalic anhydride (HHPA), methyl tetrahydro phthalic anhydride (MTHPA) and the like, and aromatic acid anhydrides including trimellitic anhydride (TMA), pyromellitic dianhydride (PMDA), benzophenone tetracarboxylic dianhydride (BTDA) and the like; polyphenol compounds such as novolac phenolic resins, phenolic polymers and the like; polymercaptan compounds such as polysulphide, thioester, thioether and the like; isocyanate compounds such as isocyanate prepolymers, blocked isocyanate and the like; organic acids such as carboxylic acid-containing polyester resins and the like.

(B) The curing agent of catalyst type typically includes, for example: tertiary amine compounds such as benzil dimethylamine (BDMA), 2,4,6-tris dimethylaminomethyl phenols (DMP-30) and the like; imidazole compounds such as 2-methyl imidazole, 2-ethyl-4-methyl imidazole (EMI24) and the like; Lewis acids such as $BF_3$ complex and the like.

(B) The curing agent of condensation type typically includes, for example: phenolic resin based curing agents such as novolac phenolic resin, resol phenolic resin and the like; urea resins such as methylol group-containing urea resins and the like; melamine resins such as methylol group-containing melamine resins and the like.

Among these, phenolic resin based curing agents are preferable, in view of good balance among fire retardancy, humidity resistance, electric characteristics curability, storage stability and the like. The phenolic resin based curing agent generally includes all of monomer, oligomer and polymer having two or more phenolic hydroxyl group in a single molecular, and while the molecular weight and the molecular structure are not particularly limited, such phenolic resin based curing agent includes, for example: novolac resins such as phenol novolac resins, creosol novolac resins and the like; multiple functional group-containing phenolic resins such as triphenolmethane phenolic resins and the like; modified phenolic resins such as terpene-modified phenolic resins, dicyclopentadiene-modified phenolic resins and the like; aralkyl-based resins such as phenol aralkyl resins having phenylene backbone and/or biphenylene backbone, naphthol aralkyl resins having phenylene and/or bi phenylene backbone and the like; bisphenol compounds such as bisphenol A, bisphenol F and the like, and these may be employed alone or in a form of a combination of two or more thereof.

While the lower limit of the formulation rate of (B) the whole curing agent is not particularly limited, it is preferable to be equal to or higher than 0.8% by mass over the whole epoxy resin composition for encapsulating semiconductor device according to the present invention, and it is more preferable to be equal to or higher than 1.5% by mass. The lower limit of the formulation rate within the above-described range provides sufficient fluidity. In addition, while the upper limit of the formulation rate of (B) the whole curing agent is not particularly limited, it is preferable to be equal to or lower than 16% by mass over the whole epoxy resin composition for encapsulating semiconductor device according to the present invention, and it is more preferable to be equal to or lower than 14% by mass. The upper limit of the formulation rate within the above-described range provides reduced threats for causing deterioration of reliability in the moisture resistance due to increased water absorption and the like.

In addition, when the compounding ratio of the epoxy resin and the phenolic resin-based curing agent in the case that the phenolic resin-based curing agent is employed as the curing agent (B) is concerned, it is preferable that an equivalent ratio (EP)/(OH) of number of epoxy group (EP) in the whole epoxy resin and number of phenolic hydroxyl group (OH) in the whole phenolic resin-based curing agent is equal to or higher than 0.8 and equal to or lower than 1.3. The equivalent ratio within the above-described range provides reduced threats for causing deterioration in the curability of the epoxy resin composition for encapsulating semiconductor device according to the present invention or deterioration in the physical properties of the cured product of the epoxy resin composition for encapsulating semiconductor device according to the present invention and the like.

The epoxy resin composition for encapsulating semiconductor device according to the present invention contains (C) inorganic fillers, and (C) the inorganic filler contains particles having particle diameter of equal to or smaller than two-thirds of the thinnest filled thickness at a rate of equal to or higher than 99.9% by mass may be employed. The use of the filler within the above-described range allows the present invention to be applicable to semiconductor devices having semiconductor elements stacked thereon and semiconductor devices with finer pitches of wires. The filler within the above-described range allows preventing poor filling of the epoxy resin composition for encapsulating semiconductor device and preventing wire sweep, in which larger particles are caught between wires to push thereof. Such inorganic fillers may be obtained by using commercially available inorganic fillers as they are, or by mixing or sieving plurality of fillers or the like to prepare them. The particle size distribution of the inorganic filler employed in the present invention can be measured by employing a commercially available laser particle size analyzer (for example, manufactured by Shimadzu Corporation, SALD-7000, or the like). In this case, the thinnest filled thickness is equivalent to the thinnest thickness among the thickness distribution along the depositing direction of an air gap fowled during the deposition of the semiconductor element, and for example, it is preferable to be equivalent to the thinnest thickness among the thickness distribution along the depositing direction of an air gap between two semiconductor elements stacked through a spacer therebetween, or equivalent to the thinnest thickness among the thickness distribution along the depositing direction of an air gap between the stacked semiconductor element and the lead frame. An associated thing is preferable.

Here, Patent Document 4 describes molding material of an epoxy resin for encapsulation for general semiconductor devices containing the inorganic filler of a fused silica, in which the component ratio of the fraction having particle size of equal to or larger than 100 μm is equal to or lower than 0.1% by weight.

On the contrary, it is found from the results of the investigations of the present inventors that the inorganic filler described in the above-described Patent Document 4 may provide insufficient filling for an air gap formed when the semiconductor elements are stacked (for example, an air gap between two semiconductor elements stacked through a spacer therebetween or an air gap between the stacked semiconductor element and the lead frame). To solve the problem, it is found that a semiconductor device with improved reliability, which exhibits reduced generation of poor filling can be obtained by employing an inorganic filler, in which (C) inorganic filler contains particles having particle diameter of larger than two-thirds of the thinnest filled thickness at a rate of equal to or lower than 0.1% by mass.

Here, in Patent Document 3, a gold wire having lower strength that that of a copper wire is employed for the wire. In general, decreased particle diameter of the inorganic filler provides increased viscosity of the encapsulating resin. Thus, when the encapsulation is made with the encapsulating resin containing inorganic filler in Patent Document 3, decreased particle diameter of the inorganic filler causes a threat for deteriorated wire sweep rate.

On the contrary, in the present invention, the material of the wire and the diameter of the wire are suitably selected while (C) the inorganic filler contains particles having particle diameter of equal to or smaller than two-thirds of the thinnest filled thickness at a rate of equal to or higher than 99.9% by mass is employed, so that a semiconductor device exhibiting enhanced wire sweep rate while having improved filling capability can be obtained. In addition, in particular, the use of a copper wire having higher strength than that of a gold wire provides a semiconductor device exhibiting further enhanced wire sweep rate and enhanced fine pitch characteristic.

(C) The inorganic filler may be that employed for general epoxy resin composition for encapsulating semiconductor device. For example, it includes fused spherical shape silica, fused crushed silica, crystalline silica, talc, alumina, titanium white, silicon nitride and the like, and among these, fused spherical shape silica is particularly preferable. For (C) the inorganic fillers, there is no objection to use one of these alone or in a form of a combination of two or more thereof. In addition, concerning the shape of (C) the inorganic filler, in order to prevent an increase of the melt viscosity of the epoxy resin composition for encapsulating semiconductor device according to the present invention and to further enhance the loading of (C) the inorganic filler, it is preferable to be as truly spherical as possible and to have broader particle size distribution. In addition, (C) the inorganic filler may be surface-treated with a coupling agent. Further, (C) the inorganic filler may be previously treated with an epoxy resin or a phenolic resin as required to be employed. Available treatment method includes a method for mixing thereof with a solvent and then removing the solvent, a method for directly adding thereof to the inorganic filler and mixing thereof by using a mixer, and the like.

While the content rate of (C) the inorganic filler is not limited, it is preferable to be equal to or higher than 60% by mass over the whole epoxy resin composition for encapsulating semiconductor device according to the present invention, and it is further desirable to be equal to or higher than 65% by mass, in consideration for the filling capability of the epoxy resin composition for encapsulating semiconductor device according to the present invention and the reliability of the semiconductor device of the present invention. The range of not lower than the above-described lower limit allows providing reduced hygroscopic property and reduced thermal expansion, and thus provides reduced threats for causing deterioration in the moisture proof reliability. In addition, in view of the moldability, the upper limit of the content rate of (C) the inorganic filler is preferably to be equal to or lower than 92% by mass over the whole epoxy resin composition for encapsulating semiconductor device according to the present invention, and is more preferable to be equal to or lower than 89% by mass. The range of not higher than the above-described upper limit allows providing reduced threats for causing problems such as insufficient filling in the molding process and the like due to a decrease of the fluidity or wire sweep within the semiconductor device due to the increased viscosity and the like.

A cure accelerator may be further employed for the epoxy resin composition for encapsulating semiconductor device according to the present invention. It is sufficient that the cure accelerator may accelerate cross-linking reaction of epoxy group in the epoxy resin with the curing agent (for example, with phenolic hydroxyl group in the phenolic resin-based curing agent), and a product for employing general epoxy resin composition for encapsulating semiconductor device man be employed. For example, the cure accelerator may include: diazabicyclo alkenes and their derivative such as 1,8-diazabicyclo(5,4,0)undecene-7 and the like; organic phosphines such as triphenylphosphine, methyldiphenylphosphine and the like; imidazole compounds such as 2-methyl imidazole and the like; tetrasubstituted phosphonium, tetrasubstituted borate such as tetraphenylphosphonium, tetraphenyl borate and the like; addition products of a phosphine compound and a quinone compound, and the like, and these may be employed alone or in a form of a combination of two or more thereof.

While the lower limit of the blending rate of the cure accelerator is not particularly limited, it is preferable to be equal to or higher than 0.05% by mass over the whole epoxy resin composition for encapsulating semiconductor device according to the present invention, and it is more preferable to be equal to or more than 0.1% by mass. The lower limit of the blending ratio of the cure accelerator within the above-described range provides reduced threats for causing deterioration in the curability. On the other hand, while the upper limit of the blending ratio of the cure accelerator is not particularly limited, it is preferable to be equal to or lower than 1% by mass over the whole epoxy resin composition for encapsulating semiconductor device according to the present invention, and it is more preferable to be equal to or lower than 0.5% by mass. The upper limit of the blending ratio of the cure accelerator within the above-described range provides reduced threats for causing a deterioration in the fluidity.

The epoxy resin composition for encapsulating semiconductor device according to the present invention may further suitably contain various types of additives as required, such as: aluminum corrosion inhibitors such as zirconium hydroxide and the like; inorganic ion exchangers such as bismuth oxide hydrate and the like; coupling agents such as γ-glycidoxypropyltrimethoxysilane, 3-mercapto propyl trimethoxysilane, 3-aminopropyltrimethoxysilane and the like; coloring agents such as carbon black, red ocher and the like; stress reducer components such as silicone rubber and the like; mold releasing agents such as nature waxes including carnauba wax and the like, higher fatty acids and metallic salts thereof including synthesized wax, zinc stearate and the like, and paraffins; and antioxidant and the like.

The epoxy resin composition for encapsulating semiconductor device according to the present invention typically includes, for example, a product manufactured by mixing the above-mentioned respective components at an ambient temperature with a mixer or the like, a product manufactured by, in addition to above processes, subsequently melting and kneading the mixed product with a kneading machine such as a roller, a kneader, an extruder and the like and then cooling the kneaded product and then pulverizing the cooled product, and the like, and thus a products having suitably adjusted dispersibility and fluidity and the like as required may be employed.

Figure 2:
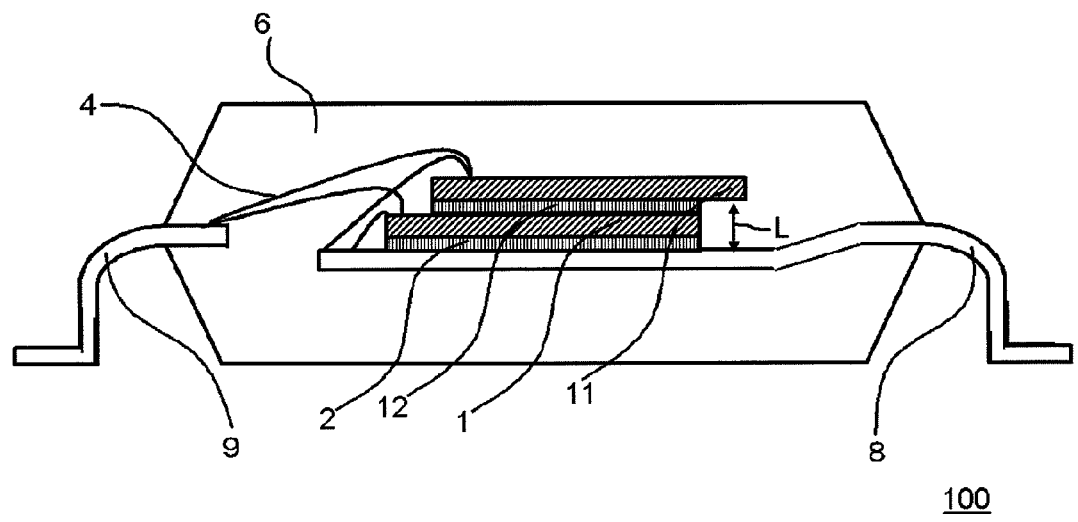

Next, the structure of the semiconductor device of the present invention will be described. FIG. 1 and FIG. 2 illustrate cross-sectional views of an example of a semiconductor device 100 employing a resin composition for encapsulating semiconductor device according to the present invention. In the semiconductor device of the present invention, two or more semiconductor elements are stacked and mount on a lead frame, the lead frame is electrically joined to the semiconductor element with a wire, and the semiconductor element, the wire and an electric junction are encapsulated with a cured product of an epoxy resin composition for encapsulating semiconductor device. More specifically, in the semiconductor device 100 of the present invention as shown in FIG. 1, a semiconductor element 1 is fixed on a die pad 3 of a lead frame 10 through an adhesive agent layer 2. A semiconductor element 11 is fixed as being stacked over the semiconductor element 1 through a spacer 7. Electrode pads of the semiconductor elements 1 and 11 are electrically coupled to a lead section 5 of the lead frame 10 with wires 4. The semiconductor elements 1 and 11 are encapsulated with a cured product 6 of the resin composition for encapsulating semiconductor device according to the present invention. In this semiconductor device 100, the semiconductor element 11 is stacked over the semiconductor element 1 through the spacer 7 to provide an air gap between the semiconductor element 1 and the semiconductor element 11, and such air gap, in turn, is filled with the cured product of the epoxy resin composition for encapsulating semiconductor device according to the present invention (cured product 6) to configure a filled section having thinnest filled thickness L. Moreover, in the semiconductor device 100, the thinnest filled thickness L is equivalent to the thinnest thickness among the thickness distribution along the depositing direction of the spacer 7.

Here, while the thickness along the depositing direction of the spacer 7 is not particularly limited, it is preferable to be equal to or higher than 0.01 mm and equal to or lower than 0.2 mm, and it is more preferable to be equal to or higher than 0.05 mm and equal to or lower than 0.15 mm.

Moreover, in the semiconductor device 100 of the present invention as shown in FIG. 2, the semiconductor element 1 is fixed over the lead frame 8 through the adhesive agent layer 2. The semiconductor element 11 is fixed so as to be overhanging and being stacked over the semiconductor element 1 through the adhesive agent layer 12. The electrode pads of these semiconductor elements 1 and 11 are electrically coupled to the lead frames 8 and 9 with the wires 4. The semiconductor elements 1 and 11 are encapsulated with the cured product 6 of the resin composition for encapsulating semiconductor device according to the present invention. In this semiconductor device 100, the semiconductor element 11 is stacked over the semiconductor element 1 so as to overhang thereof to provide an air gap between the semiconductor element 1 and the semiconductor element 11, and such air gap, in turn, is filled with the cured product of the epoxy resin composition for encapsulating semiconductor device according to the present invention (cured product 6) to configure a filled section having thinnest filled thickness L. Moreover, in the semiconductor device 100, the thinnest filled thickness L is equivalent to the thickness along the depositing direction of the air gap of the stacked semiconductor element 11 and the lead frame 8.

As described above, the semiconductor element for being encapsulated with the epoxy resin composition for encapsulating semiconductor device according to the present invention is not particularly limited, and includes, for example, integrated circuits, large scale integrated circuits, solid-state image sensing elements and the like. Specific conformations of the semiconductor devices may include, for example, TSOP, QFP and the like. The semiconductor element of the first level is adhered to an island of the lead frame with a film adhesive agent, a thermosetting adhesive and the like. The semiconductor elements of the second or larger levels are consecutively stacked with an insulating film adhesive agent. In order to prevent interference and contact between a wire and a semiconductor element, the semiconductor elements of the second or larger levels may be adhered to overhang thereof (a portion of the semiconductor element is not adhered), or may be adhered through a spacer. The spacer may preferably have a thermal expansion coefficient which is closer to that of the semiconductor element, in view of a stress relaxation. In the above description, the peripheral part of the adhesive agent in the case where the semiconductor elements of the second or larger levels are adhered to overhang thereof (a portion of the semiconductor element is not adhered), and the peripheral part of the spacer in the case where it is adhered through the spacer, are equivalent to the thinnest filled thickness section in the semiconductor device having two or more semiconductor elements stacked and installed to the lead frame.

It is preferable that the lead section of the lead frame is joined to the semiconductor element, by a reverse bonding of the wire. In the reverse bonding process, a ball formed at the tip of the wire is first joined to a pad portion of the semiconductor element, and the wire is cut to form a bump for the stitch junction. In next the ball formed at the tip of the wire is joined to a metallic-plated lead section of the lead frame, and a stitch junction with the bump of the semiconductor element is created. Since the reverse bonding can achieve lower wire height over the semiconductor element than that in the positive bonding, lower height of the junction of the semiconductor element can be achieved.

The semiconductor device of the present invention is obtained by encapsulating the electronic components such as semiconductor elements and the like with the epoxy resin composition for encapsulating semiconductor device according to the present invention, and then curing thereof with a conventional molding process such as transfer molding, compression molding, injection molding and the like. It is preferable that the semiconductor device encapsulated by the forming process such as transfer molding process is installed to electronic equipments and the like after the complete cure is carried out for the time duration of from 10 minutes to 10 hours as they are or at a temperature of 80 degrees C. to 200 degrees C. or the like.

As described above, according to the present invention, a semiconductor device with improved reliability, which exhibits reduced generation of poor filling of an epoxy resin composition for encapsulating a semiconductor chip according to the present invention, can be obtained, so that it can be preferably applicable to a multi-chip type semiconductor device having a current path that is narrowly complicated, particularly a semiconductor device including multiple stacked layers of semiconductor elements.

In addition to above, it is needless to point out that combination of any of the embodiments described above and a plurality of modified embodiments can be employed unless the contents are incompatible. Moreover, while the structures of the respective elements are specifically described in the embodiments and the modified embodiments described above, such structures may be suitably modified as long as the modifications still satisfy the present invention.

EXAMPLES

While examples of the present invention will be shown below, it is not intended that the present invention is limited thereto. The blending ratio is presented by mass ratio. Respective components of the epoxy resin composition for encapsulating semiconductor device employed in examples and comparative examples are shown below.

Respective components of the epoxy resin composition for encapsulating semiconductor device:

Ortho creosol novolac epoxy resin (E-1: manufactured by Nippon Kayaku Co., Ltd., EOCN1020, softening point 55 degrees C., epoxy equivalent 196)

Phenol aralkyl epoxy resin having a biphenylene backbone (E-2: manufactured by Nippon Kayaku Co., Ltd., NC 3000, softening point 58 degrees C., epoxy equivalent 274)

Phenol novolac resin (H-1: manufactured by Sumitomo Bakelite Co., Ltd., PR-HF-3, softening point 80 degrees C., hydroxyl equivalent 104)

Phenol aralkyl resin having biphenylene backbone (H-2: manufactured by Meiwa Plastic Industries Co., Ltd., MEH-7851SS, softening point 65 degrees C., hydroxyl equivalent 203)

Fused spherical shape silica-1 (manufactured by Denki Kagaku Kogyo K. K., FB-100x, ratio of particles of equal to or smaller than 100 μm:>99.9% by mass, ratio of particles of equal to or smaller than 67 μm: 87.4% by mass)

Fused spherical shape silica-2 (manufactured by Denki Kagaku Kogyo K. K., obtained by sieving FB-100x with the sieve of 300 mesh, ratio of particles of equal to or smaller than 67 μm:>99.9% by mass, ratio of particles of equal to or smaller than 33 μm:73.7%)

Fused spherical shape silica-3 (manufactured by Denki Kagaku Kogyo K. K., FB-5SDC, ratio of particles of equal to or smaller than 33 μm: >99.9% by mass)

Cure accelerator: triphenylphosphine (TPP)

Silane coupling agent: epoxysilane (γ-glycidoxypropyltrimethoxysilane)

Coloring agent: carbon black

Mold releasing agent: carnauba wax

The respective semiconductor packages employed in the evaluation of the filling capability and the wire sweep rate:

PKG-1: 44p TSOP. Package size: 18×10×1.0 mm, 42 alloy lead frame. Island size: 5.0×8.5 mm, the first level chip size: 4.5×8.0×0.10 mm. Spacer size: 3×5×0.15 mm. The second level chip size: 4.5×8.0×0.10 mm. Copper wire: obtained by providing palladium coating of 0.01 μm for TC-E manufactured by Tatsuta Electric Wire and Cable Co., Ltd. (copper purity 99.99% by mass, line size 25 μm). The chips and the leads were joined by reverse bonding process.

PKG-2: 44p TSOP. Package size: 18×10×1.0 mm, 42 alloy lead frame. Island size: 5.0×8.5 mm, the first level chip size: 4.5×8.0×0.10 mm. Spacer size: 3×5×0.10 mm. The second level chip size: 4.5×8.0×0.10 mm. Copper wire: obtained by providing palladium coating of 0.01 μm for TC-E manufactured by Tatsuta Electric Wire and Cable Co., Ltd. (copper purity 99.99% by mass, line size 25 μm). The chips and the leads were joined by reverse bonding process.

PKG-3: 44p TSOP. Package size: 18×10×1.0 mm, 42 alloy lead frame. Island size: 5.0×8.5 mm, the first level chip size: 4.5×8.0×0.10 mm. Spacer size: 3×5×0.05 mm. The second level chip size: 4.5×8.0×0.10 mm. Copper wire: obtained by providing palladium coating of 0.01 μm for TC-E manufactured by Tatsuta Electric Wire and Cable Co., Ltd. (copper purity 99.99% by mass, line size 25 μm). The chips and the leads were joined by reverse bonding process.

PKG-4: 44p TSOP. Package size: 18×10×1.0 mm, 42 alloy lead frame. Island size: 5.0×8.5 mm, the first column chip size: 4.5×8.0×0.10 mm. Spacer size: 3×5×0.15 mm. The second step chip size: 4.5×8.0×0.10 mm. The gold wire: AW66 manufactured by Kulicke & Soffa, Ltd. (gold purity 99.99% by mass, line size 25 μm). The chips and the leads were joined by reverse bonding process.

PKG-5: 44p TSOP. Package size: 18×10×1.0 mm, 42 alloy lead frame. Island size: 5.0×8.5 mm,
The first level chip size: 4.5×8.0×0.10 mm. Spacer size: 3×5×0.10 mm. The second level chip size: 4.5×8.0×0.10 mm. The old wire: AW66 manufactured by Kulicke & Soffa, Ltd. (gold purity 99.99% by mass, line size 25 μm). The chips and the leads were joined by reverse bonding process.

Manufacture of the epoxy resin composition for encapsulating semiconductor device:

Example 1

| | |
|---|---|
| E-1 | 12.43 mass ratio |
| H-1 | 6.52 mass ratio |
| Fused spherical shape silica -1 | 80 mass ratio |
| TPP | 0.15 mass ratio |
| Epoxy silane | 0.2 mass ratio |
| Carbon black | 0.3 mass ratio |
| Carnauba wax | 0.4 mass ratio |

The above components were mixed by using a mixer at an ambient temperature, and were then kneaded with a roller at 70 to 100 degrees C., and after they were cooled, were pulverized to obtain the epoxy resin composition for encapsulating semiconductor device.

Examples 2 to 5, Comparative Examples 1 and 2

According to the formulations of the epoxy resin compositions for encapsulating semiconductor device described in Table 1, the epoxy resin compositions for encapsulating semiconductor device were obtained similarly as in Example 1.

The following evaluations were conducted for the epoxy resin compositions for encapsulating semiconductor device obtained in the respective examples and comparative examples. An obtained result is shown in table 1.

Evaluation Method
(Evaluation of Epoxy Resin Composition for Encapsulating Semiconductor Device)

Spiral flow: The epoxy resin composition for encapsulating semiconductor device was injected into a metallic mold for spiral flow measurement, which is pursuant to EMMI-1-66, by using a low pressure transfer molding machine (manufactured by Kohtaki Precision Machine Co., Ltd., KTS-15) under the condition of the metallic mold temperature of 175 degrees C., the injection pressure of 6.9 MPa, and the curing time of 120 seconds, to measure the fluidized length. The unit was centimeter (cm).

The fluidized length of equal to or lower than 80 cm may cause a molding failure such as poor filling for the package and the like.

(Evaluation of Semiconductor Package)

Filling ability: Silicon chips and the like were encapsulated with the epoxy resin composition for encapsulating semiconductor device by using a low pressure transfer automated molding machine (manufactured by Dai-Ichi Seiko Co., Ltd., GP-ELF) under the condition of the metallic mold temperature of 175 degrees C., the injection pressure of 9.8 MPa, and the curing time of 70 seconds to obtain an evaluation package described in Table 1. The filling capability of the epoxy resin composition for encapsulating semiconductor device was observed by using a scanning acoustic tomography device (manufactured by Hitachi Kenki Fine Tech Co., Ltd., miscope hyper II). The thinnest thickness among the thicknesses of the depositing direction of the air gap (clearance) between the chip of the first level and the chip of the second level near the spacer is assumed to be thinnest filled thickness. In this case, the thinnest filled thickness is equivalent to the spacer thickness. It was determined that the poor filling in the gap (clearance) between the chip of the first level and the chip of the second level near the spacer was the failure. The number of the evaluated package was 20. When the number of the failure package is "n", it is represented to be n/20.

The wire sweep rate: The package employed in the evaluation for the filling capability is taken with a soft X-ray fluoroscopy apparatus (manufactured by Softex Co., Ltd., PRO-TEST100), and the wire length and the sweep level (maximum distance from the line between the wire ends to the wire) was measured for 22 wires. The wire sweep rate is represented by a percentage of (current level)/(wire length), and the maximum value of the 22 measurements is presented. The unit thereof is percent (%). Such value of beyond 5% highly possibly allows causing a mutual contact of the adjacent wires.

TABLE 1

| | | | EXAMPLES | | | | | COMPARATIVE EXAMPLES | |
|---|---|---|---|---|---|---|---|---|---|
| | | | 1 | 2 | 3 | 4 | 5 | 1 | 2 |
| EPOXY RESIN COMPOSITION FOR ENCAPSULATING SEMICONDUCTOR DEVICE | FORMULATIONS (PARTS BY MASS) | E-1 | 12.43 | | | 12.43 | | 12.43 | |
| | | E-2 | | 16.65 | 16.65 | | 16.65 | | 16.65 |
| | | H-1 | 6.52 | | | 6.52 | | 6.52 | |
| | | H-2 | | 12.25 | 12.25 | | 12.25 | | 12.25 |
| | | FUSED SPHERICAL SILICA-1 | 80 | | | 80 | | 80 | |
| | | FUSED SPHERICAL SILICA-2 | | 70 | | | 70 | | 70 |
| | | FUSED SPHERICAL SILICA-3 | | | 70 | | | | |
| | | TPP | 0.15 | 0.20 | 0.20 | 0.15 | 0.20 | 0.15 | 0.20 |
| | | EPOXYSILANE | 0.2 | 0.2 | 0.2 | 0.2 | 0.2 | 0.2 | 0.2 |
| | | CARBON BLACK | 0.3 | 0.3 | 0.3 | 0.3 | 0.3 | 0.3 | 0.3 |
| | | CARNAUBA WAX | 0.4 | 0.4 | 0.4 | 0.4 | 0.4 | 0.4 | 0.4 |

TABLE 1-continued

|  |  |  | EXAMPLES | | | | | COMPARATIVE EXAMPLES | |
|---|---|---|---|---|---|---|---|---|---|
|  |  |  | 1 | 2 | 3 | 4 | 5 | 1 | 2 |
|  | RATIO OF PARTICLES OF INORGANIC FILLER [mass ratio(%)] | PARTICLES OF EQUAL TO OR SMALLER THAN 100 μm | >99.9 | >99.9 | >99.9 | >99.9 | >99.9 | >99.9 | >99.9 |
|  |  | PARTICLES OF EQUAL TO OR SMALLER THAN 67 μm | 87.4 | >99.9 | >99.9 | 87.4 | >99.9 | 87.4 | >99.9 |
|  |  | PARTICLES OF EQUAL TO OR SMALLER THAN 33 μm | — | 73.7 | >99.9 | — | 73.7 | — | 73.7 |
|  | SPIRAL FLOW[cm] |  | 83 | 74 | 68 | 83 | 74 | 83 | 74 |
| SEMI-CONDUCTOR PACKAGE | NAME OF PACKAGE |  | PKG-1 | PKG-2 | PKG-3 | PKG-4 | PKG-5 | PKG-2 | PKG-3 |
|  | THINNEST FILLING THICKNESS = THICKNESS OF SPACER[mm] |  | 0.15 | 0.10 | 0.05 | 0.15 | 0.10 | 0.10 | 0.05 |
|  | WIRE DIAMETER [μm] | WIRE DIAMETER[μm] | 25 | 25 | 25 | 25 | 25 | 25 | 25 |
|  |  | MATERIAL | COPPER | COPPER | COPPER | GOLD | GOLD | COPPER | COPPER |
|  |  | NAME OF PRODUCT | TC-E | TC-E | TC-E | AW66 | AW66 | TC-E | TC-E |
|  |  | PURITY OF COPPER OR GOLD [mass ratio(%)] | 99.99 | 99.99 | 99.99 | 99.99 | 99.99 | 99.99 | 99.99 |
|  |  | THICKNESS OF PALLADIUM COATING LAYER[μm] | 0.01 | 0.01 | 0.01 | — | — | 0.01 | 0.01 |
|  | METHOD FOR FORMING CHIP/LEAD JUNCTION |  | REVERSE | REVERSE | REVERSE | REVERSE | REVERSE | REVERSE | REVERSE |
|  | FILLING CAPABILITY (NUMBER OF FAILED PACKAGE n/20) |  | 0/20 | 0/20 | 0/20 | 0/20 | 0/20 | 18/20 | 20/20 |
|  | WIRE SWEEP RATE[%] |  | 3.1 | 2.4 | 4.0 | 6.5 | 7.2 | 3.4 | 3.7 |

As can be seen from Table 1, Examples 1 to 5 where an inorganic filler containing particles having particle diameter of equal to or lower than two-thirds of the thinnest filled thickness at a rate of equal to or higher than 99.9% by mass provides the results for the enhanced filling capability. Moreover, Example 1 to 3 employing the copper wire provides enhanced wire sweep ratio.

The present application claims a priority based on Japanese Patent Application No. 2009-206,535 filed on Sep. 8, 2009, the disclosures of which are incorporated by reference.

The invention claimed is:

1. A semiconductor device comprising two or more semiconductor elements that are stacked and mounted on a lead frame, the lead frame is electrically joined to the two or more semiconductor elements with a wire, and the semiconductor elements, the wire and an electric junction are encapsulated with a cured product of an epoxy resin composition for encapsulating the semiconductor device,
wherein the epoxy resin composition for encapsulating the semiconductor device contains:
(A) an epoxy resin;
(B) a curing agent; and
(C) an inorganic filler;
wherein the inorganic filler contains particles having particle diameter of equal to or smaller than two-thirds of a thinnest filled thickness at a rate of equal to or higher than 99.9% by mass; and
the content rate of the inorganic filler is equal to or higher than 60% by mass and is equal to or lower than 92% by mass over the epoxy resin composition for encapsulating the semiconductor device.

2. The semiconductor device according to claim 1, wherein the semiconductor elements are stacked to provide an air gap, and the air gap is filled with the cured product of the epoxy resin composition for encapsulating the semiconductor device to constitute a filled section having the thinnest filled thickness.

3. The semiconductor device according to claim 2, wherein the thinnest thickness of the air gap between the semiconductor element and the semiconductor element or the air gap between the semiconductor element and the lead frame along the stack direction is equivalent to the thinnest filled thickness.

4. The semiconductor device according to claim 1, wherein the wire is a copper wire.

5. The semiconductor device according to claim 1, wherein the semiconductor elements are stacked to be mounted on the lead frame through a spacer, and
wherein the inorganic filler contains particles having particle diameter of equal to or smaller than two-thirds of the thickness of the spacer at a rate of equal to or higher than 99.9% by mass.

6. The semiconductor device according to claim 1, wherein the inorganic, filler contains silica.

7. The semiconductor device according to claim 1, wherein the lead frame is electrically joined to the semiconductor element by a reverse bonding of the wire.

8. The semiconductor device according to claim 4, wherein purity of copper in the copper wire is equal to or higher than 99.99% by mass.

9. The semiconductor device according to claim 4, wherein the copper wire includes a coating layer on the surface, the coating layer being composed of a metallic material containing palladium.

10. The semiconductor device according to claim 9, wherein the thickness of the coating layer is equal to or larger than 0.001 μm and equal to or smaller than 0.02 μm.

11. The semiconductor device according to claim 5, wherein the thickness of the spacer is equal to or larger than 0.01 mm and equal to or smaller than 0.2 mm.

12. The semiconductor device according to claim 1, wherein the semiconductor elements include a first semiconductor element and a second semiconductor element stacked through only a spacer;
wherein the spacer has a smaller plane area than the first semiconductor element and the second semiconductor element; and
wherein a filled section having the thinnest filled thickness is between the first semiconductor element and the second semiconductor element.

13. The semiconductor device according to claim 1, wherein the epoxy resin composition for encapsulating the semiconductor device contains a phenolic resin based curing agent as the curing agent.

* * * * *